United States Patent [19]

Takasago

[11] 4,322,637
[45] Mar. 30, 1982

[54] SOLID STATE SWITCH

[75] Inventor: Hiroaki Takasago, Yokohama, Japan

[73] Assignee: Tokyo Shibaura Denki Kabushiki Kaisha, Japan

[21] Appl. No.: 130,596

[22] Filed: Mar. 17, 1980

[30] Foreign Application Priority Data

Apr. 4, 1979 [JP] Japan .................. 54-39751

[51] Int. Cl.³ .............................. H03K 17/72
[52] U.S. Cl. .................. 307/252 A; 307/252 B; 307/252 UA; 307/311
[58] Field of Search ........ 307/252 A, 252 B, 252 UA, 307/ 252 N, 305, 311

[56] References Cited

U.S. PATENT DOCUMENTS

| | | | |
|---|---|---|---|
| 3,328,606 | 6/1967 | Pinckaers | 307/252 B |
| 3,708,672 | 1/1973 | Marinkovic | 307/252 A |
| 3,816,763 | 6/1974 | Korn et al. | 307/252 A |
| 4,129,785 | 12/1978 | Kadah | 307/311 X |
| 4,176,288 | 11/1979 | Komatsu et al. | 307/252 A |
| 4,212,024 | 7/1980 | Sugawara et al. | 307/305 X |

Primary Examiner—John Zazworsky
Attorney, Agent, or Firm—Finnegan, Henderson, Farabow, Garrett & Dunner

[57] ABSTRACT

A solid state switch comprises a photo-thyristor optically coupled to a light emitting diode for actuating the photo-thyristor; a photo-diode, with anode and cathode electrodes thereof connected to the cathode and anode electrodes of the photo-thyristor, respectively; and a second light emitting diode for activating, upon energization thereof, the photo-diode to keep the gate electrode of the photo-thyristor in a backwardly biased state. The second light emitting diode may be energized from voltage appearing between the anode and cathode electrodes of the photo-thyristor to form a zero-voltage activated solid state switch.

12 Claims, 9 Drawing Figures

SOLID STATE SWITCH

BACKGROUND OF THE INVENTION

This invention relates to solid state switches, and more particularly to solid state switches operable through photocoupling.

Well-known solid state switches include a-c current carrying semiconductor switching devices and control thyristors for triggering the a-c current carrying switching devices. The a-c current carrying switching devices may comprise bi-directional thyristors, paired uni-directional thyristors connected in reverse-parallel relation, and the like. The control thyristors may be uni-directional thyristors, and are preferably photo-thyristors. Such control thyristors are energized by d-c current obtained through rectifying devices from a-c voltage across the a-c current carrying switching devices. In U.S. Pat. Nos. 3,328,606 and 3,816,763, for example, there are disclosed one kind of such solid state switches called zero-voltage switches, which may turn-on only when the a-c current supply voltage is equal to or near zero.

It is known that the control thyristors of such switches when in the non-conductive state are liable to turn-on without any triggering signal thereto due to abrupt changes in voltage applied across the control thyristors. Abrupt voltage changes include a relatively high dv/dt component therein.

Resistors connected between gates and cathodes of the control thyristors contribute to reduce the sensitivity of the control thyristors to such relatively high dv/dt components.

It is also known in the art to provide capacitors connected in parallel with the above-mentioned resistors for by-passing current which appears, due to the existence of junction capacitance in the control thyristors, upon sudden voltage changes applied across the anodes and cathodes of the control thyristors and is liable to trigger the control thyristors, as set forth hereinafter.

However, these resistors and capacitors do not provide enough protection to prevent undesirable turning-on of the control thyristors.

SUMMARY OF THE INVENTION

Accordingly, it is an object of this invention to provide solid state switches which are substantially free from undesirable turn-on due to the application of abrupt changes in voltage applied across a control thyristor.

It is another object of this invention to provide such switches to simple construction and adapted to be manufactured in a small size.

It is still another object of this invention to provide such switches to function as so-called zero-voltage switches.

According to one aspect of this invention, a solid state switch comprises: a photo-thyristor having anode, cathode, and gate electrodes; first light emitting means for activating the photo-thyristor; biasing means for keeping the gate electrode of the photo-thyristor in a backwardly biased state with respect to the cathode when activated by light; and second light emitting means for activating the biasing means. The second light emitting means may be energized in response to voltage appearing between the anode and cathode of the photo-thyristor.

In another aspect of this invention, a solid state switch may also include: an a-c current carrying electronic switching means including a pair of current carrying electrodes and at least one gate electrode, the current carrying electrodes being adapted to be connected to an a-c power supply through an a-c load to be controlled; and triggering means for developing a trigger signal for the gate electrode of the electronic switching means, the triggering means including: (i) rectifying means to which a-c current is supplied from the a-c power supply;

(ii) a photo-thyristor, the photo-thyristor having anode, cathode, and gate electrodes, with the anode and cathode thereof being connected to positive and negative outputs of the rectifying means, respectively; (iii) first light emitting means for activating said photo-thyristor; (iv) biasing means for keeping the gate electrode of the electronic switching means in a backwardly biased state when activated by light; and (v) second light emitting means for activating the biasing means.

BRIEF DESCRIPTION OF THE DRAWINGS

This invention will be fully understood from the following description in conjunction with the drawings in which.

DETAILED DESCRIPTION OF THE PREFERRED EMBODIMENTS

Figure 1:
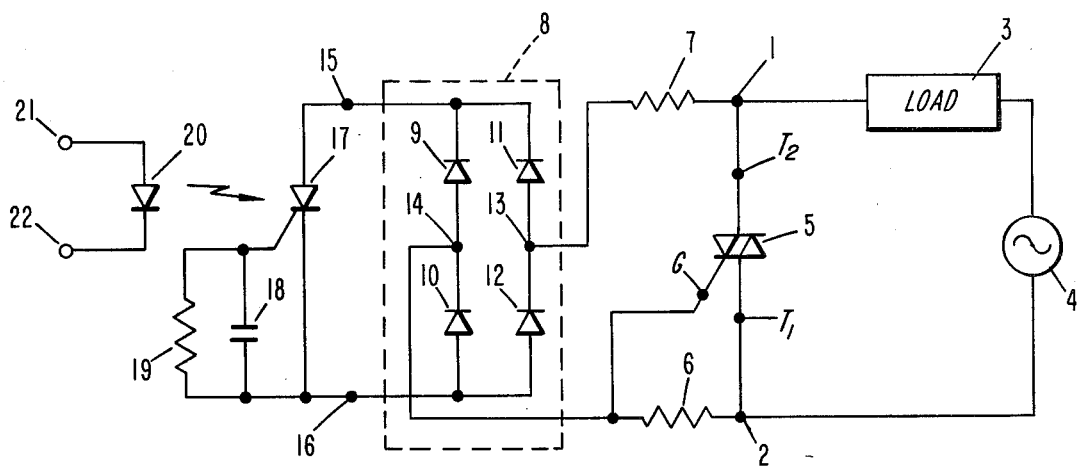
FIG. 1 shows a circuit diagram of a prior art solid state switch.

Referring to FIG. 1, there is shown a circuit diagram of a typical prior art solid state switch. Reference numerals 1 and 2 indicate load terminals, between which a series circuit of an a-c load 3 and an a-c supply 4 is connected. The solid state switch is connected to load terminals 1 and 2, and controls current through the load 3 from the a-c supply 4. Load 4 may comprise, for example, a motor, a solenoid coil for actuating valve, and the like. Provided between terminals 1 and 2 is a bi-directional current carrying thyristor 5 such as, for example, a triac. Thyristor 5 has current carrying electrodes $T_1$ and $T_2$ which are connected, respectively, to terminals 2 and 1, and also has a gate G connected to electrode $T_1$ through a resistor 6. Reference numeral 8 indicates generally a full wave rectifier comprising diodes 9, 10, 11 and 12 arranged in a bridge connection. The a-c terminals 13 and 14 of rectifier 8 are connected, respectively, to terminal 1 through a resistor 7 and to terminal 2 through a resistor 6. Positive and negative d-c terminals 15 and 16 of rectifier 8 are connected, respectively, to anode and cathode electrodes of a photo-thyristor 17. Connected between a gate and the cathode of photo-thyristor 17 are a parallel connected capacitor 18 and resistor 19. A light emitting diode 20 triggers photo-thyristor 17 through photo-coupling when light emitting diode 20 is energized through terminals 21 and 22.

The following description of the operation of this prior art switch will focus on the turning-on operation of the switch for simplicity, because the problem to be solved resides in preventing unexpected turn-on of the solid state switch, as set forth above. When bi-directional thyristor 5 is in a non-conductive state, the a-c voltage of supply 4 is applied to terminals 1 and 2, and to a-c terminals 14 and 13 of rectifier 8 through resistors 6 and 7. Thus photo-thyristor 17 is supplied with d-c voltage from the rectifier 8, the anode and cathode of photo-thyristor 17 being at positive and negative polarities, respectively.

Upon energization of light emitting diode 20 through application of a control signal to terminals 21 and 22, diode 20 emits light which activates photo-thyristor 17 to turn-on to a conductive state. Accordingly, current begins to flow through, for example, a-c supply 4, load 3, resistor 7, diode 11, photo-thyristor 17, diode 10, and resistor 6 to a-c supply 4. The current flowing through resistor 6 causes a gate current to flow to gate G of bi-directional thyristor 5. This, in turn, triggers thyristor 5 and causes thyristor 5 to be conductive. Thus, there is formed in a closed loop of a-c supply 4, load 3, and thyristor 5 and, accordingly, load 3 is energized.

The operation of resistor 19 and capacitor 18 will now be explained.

Figure 2A:
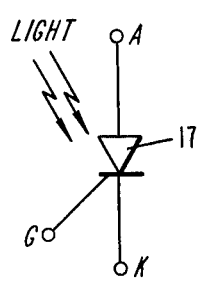
FIG. 2(a) and FIG. 2(b) show a symbol of a photo-thyristor shown in FIG. 1 and its equivalent circuit, respectively.
Figure 2B:
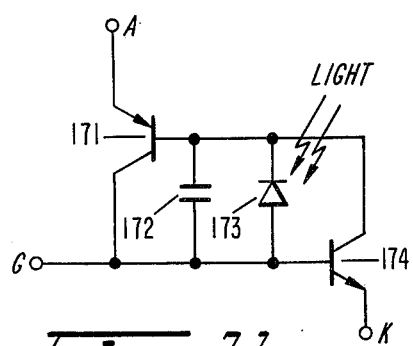
Figure 2C:
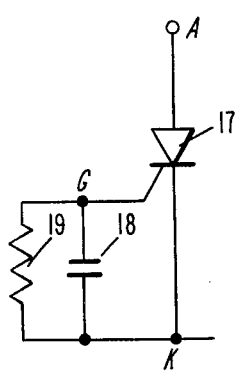
FIG. 2(c) and FIG. 2(d) show a circuit employing the photo-thyristor shown in FIG. 1 and its equivalent circuit, respectively.
Figure 2D:
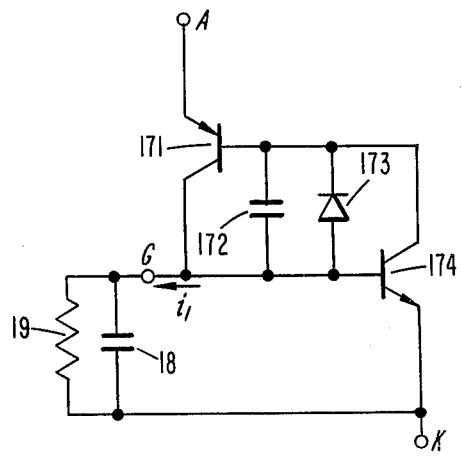
Figure 2E:
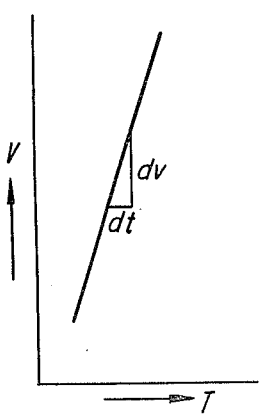
FIG. 2(e) shows a plot for explaining an abrupt change in applied voltage.

Photo-thyristor 17 having anode A, cathode K and gate G as shown in FIG. 2(a) may be equivalently expressed as a circuit including a transistor 171 of PNP-type, a capacitor 172, a photo diode 173, and a transistor 174 of NPN type as shown in FIG. 2(b).

In FIG. 2(b), the emitters of transistors 171 and 174 correspond, respectively, to anode A and cathode K of thyristor 17. The base of transistor 174, to which the collector of transistor 171 is connected, corresponds to gate G of thyristor 17. The base of transistor 171 is connected to the collector of transistor 174. The capacitor 172, representing a junction capacitance of thyristor 17, and photo-diode 173 are both connected across the bases of transistors 171 and 174. Thus, voltage is supplied to thyristor 17 in such polarity that anode A and cathode K have, respectively, positive and negative polarities, and if light impinges on photo-diode 173 and causes the same to be conductive, then this, in turn, causes a current which may be called photon-generated current. The photongenerated current flows into the base of transistor 174, and current flows from anode A to cathode K. Thus, it is expected that photo-thyristor 17 becomes conductive only when light is given to activate it.

However, there is the possibility of photo-thyristor 17 becoming conductive without any light given due to the existence of junction capacitance as illustrated by capacitor 172 in FIG. 2(b). This possibility occurs in the case where voltage across anode A and cathode K of photo-thyristor 17 changes with a relatively steep slope (i.e. dv/dt takes on a relatively large value) due to some disturbance in the system. Such voltage change causes a current to charge capacitor 172 which can be expressed by:

$$i = C \cdot (dv/dt) \quad (1)$$

where C denotes the capacitance of capacitor 172. Such charging current flows from the base to the emitter to transistor 174, and if such current exceeds a critical point, then a current carrying path between anode A and cathode K is formed.

The prior art method for preventing such undesirable switching-on of photo-thyristor 17 resides in by-passing the charging current flowing from the base to the emitter of transistor 174 by means of capacitor 18 and resistor 19. Photo-thyristor 17 provided with capacitor 18 and resistor 19 connected individually between gate G and cathode K thereof, as shown in FIG. (2c), is represented by an equivalent circuit shown in FIG. (2d). A current by-passed by capacitor 18 and resistor 19 is indicated at $i_1$. However, by-passing or drain of current from the gate G of photo-thyristor 18 sufficient to completely prevent undesirable turning-on of the photo-thyristor is very difficult to attain.

Figure 3:
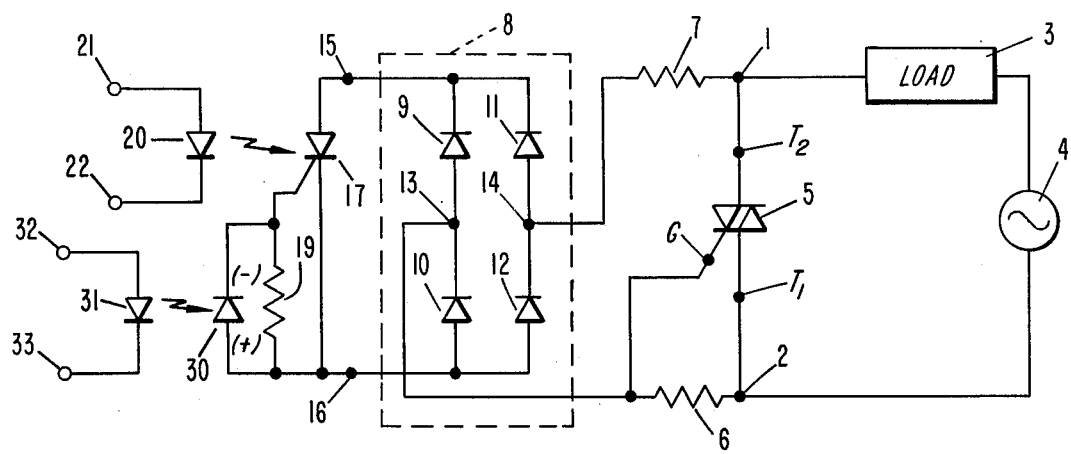
FIG. 3 shows a circuit diagram of one embodiment of a solid state switch employing the teachings of this invention.

FIG. 3 shows one embodiment according to the teaching of this invention. Similar or identical parts are indicated by the same reference numerals as above, and the following description will focus on the different portions between the prior art shown in FIG. 1 and this embodiment.

In FIG. 3, a photo-diode 30 is provided, instead of capacitor 18 in FIG. 1, such that the cathode and anode of photo-diode 30 are connected to the gate and the cathode of photo-thyristor 17, respectively. Provided further between terminals 32 and 33 is a light emitting diode 31 which emits light when energized to activate photo-diode 30 to generate electro-motive-force. Due to the photo-electro-motive-force effect, the anode and cathode of photo-diode 30 take positive and negative polarities, respectively. This has an effect on the gate of photo-thyristor 17 of causing the gate to be backwardly biased.

Figure 4:
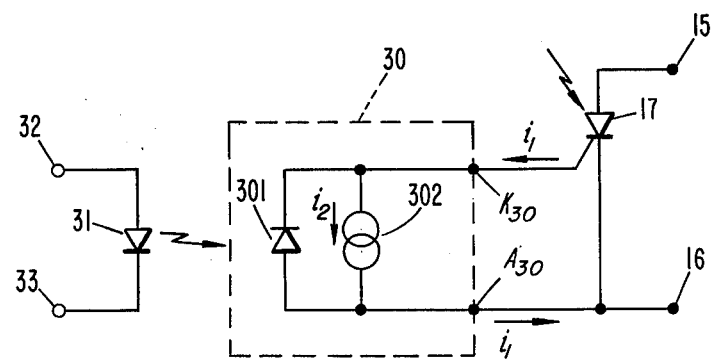
FIG. 4 shows an equivalent circuit of the photo-diode shown in FIG. 3.

In more detail, reference will be made to FIG. 4, in which photo-diode 30 is equivalently shown by a parallel connection of a diode 301 and a current source 302. Resistor 19 is omitted only for simplicity. Current source 302 has infinite inner impedance, and the value of current $i_2$ flowing from current source 302 through diode 301 is responsive to the number of photons accepted by photo-diode 30 from light-emitting diode 31. The current $i_2$ flows through the diode 301 in its forward direction. Thus, a current $i_1$, may flow through diode 30 in a reverse direction, i.e., from cathode $K_{30}$ to anode $A_{30}$, provided the current $i_1$ is substantially smaller than the current $i_2$.

Now assume photo diode 30 is energized and at the same time light is emitted from light emitting diode 20 and impinges on photo-thyristor 17 whereby photon-generated current occurs. This photon-generated current is drained from the gate of photo-thyristor 17 by diode 30 as indicated by current $i_1$ in FIG. 4, if the photon-generated current is substantially smaller than the current $i_2$ from current source 302. This means a forward current expressed by $i_2 - i_1$ flows through diode 301. The forward voltage drop between the anode and cathode of the diode 301 developed by such forward current is a potential which, in turn, causes the gate of photo-thyristor 17 to be backwardly biased. Thus, photo-thyristor 17 can be effectively prohibited from becoming turned-on.

Similar operation can be expected when charging current of the junction capacitance of the photo-thyristor 17 occurs due to an abrupt voltage change applied thereto. Such charging current which is otherwise liable to cause undesirable turning-on of the photo-thyristor 17 can effectively be by-passed by the diode 30 when the same is actuated by light from light emitting diode 31.

Thus, undesirable turn-on of a photo-thyristor due to a dv/dt component can be effectively prevented by energizing light emitting diode 31. Although it is necessary to have a flow of suitable current $i_2$, this may be easily attained by the selection of photo-diode 30 and light emitting diode 31. It is preferable to choose a design such that current $i_2$ is larger than, or equal to, the expected maximum value of $i_1$ under the required operating conditions for the system. Thus, energization of light emitting diode 31 can prohibit the turning-on of photo-thyristor 17. Further, resistor 19 functions to by-pass current when the current $i_1$ exceeds the current $i_2$, thereby preventing further undesirable turning-on of thyristor 17.

In this embodiment, photo-diode 30 is controlled through photo-coupling so that high insulation is maintained between terminals 32 and 33, and the main circuitry including photo-thyristor 17. Accordingly, rectifier 8, thyristor 17, resistor 19, photo-diode 30, and light emitting diodes 20 and 31 provide one illustrative example of trigger means for developing a trigger signal for gate G of thyristor 5.

Figure 5:
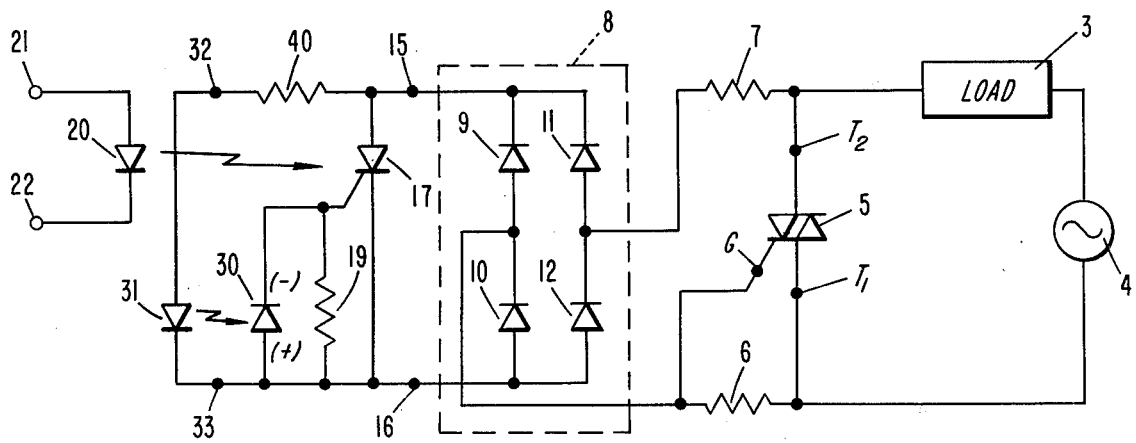
FIG. 5 shows a circuit diagram of another embodiment of a solid state switch employing the teachings of this invention.

Referring now to FIG. 5, there is shown another embodiment of this invention which operates as a so-called zero-voltage switch mentioned above.

In this embodiment, the actuation terminals 32 and 33 for light emitting diode 31 are connected, respectively, to the positive d-c output terminal 15 of rectifier 8 through a current control resistor 40, and to the negative terminal 16 of rectifier 8. Accordingly, light emitting diode 31 emits light in response to the voltage appearing on output terminals 15 and 16 of rectifier 8.

Thus, thyristor 17 can be turned-on only when the voltage applied to photo-thyristor 17 is near or equal to zero.

According to this embodiment, a zero-voltage switch of simple construction can be obtained.

It is, of course, to be understood that there may be many variations in the specific circuitry utilized. For example, thyristor 5 may comprise a pair of reverse polarized, parallel connected, uni-directional thyristors. Thus, while particular examples of the present invention have been shown and described, it will, of course, be obvious to one skilled in the art that certain advantages and modifications may be effected without departing from the spirit of the invention and, accordingly, it is intended that the scope of the invention is not determined by the foregoing examples but only by the scope of the appended claims.

What is claimed is:

1. A solid state switch comprising:
a photo-thyristor having anode, cathode, and gate electrodes;
first light emitting means for activating said photo-thyristor;
biasing means for keeping said gate electrode of said photo-thyristor in a backwardly biased state with respect to said cathode electrode when activated by light; and
second light emitting means for activating said biasing means.

2. A solid state switch according to claim 1, wherein said biasing means comprises a photo-diode, with anode and cathode electrodes thereof being connected, respectively, to said cathode and gate electrodes of said photo-thyristor.

3. A solid state switch according to claim 1, wherein said biasing means comprises a photo-diode, with anode and cathode electrodes thereof connected, respectively, to said cathode and gate electrodes of said photo-thyristor, and a resistor connected in parallel to said photo-diode.

4. A solid state switch according to claim 1, 2 or 3, wherein
said second light emitting means is formed to emit light in response to voltage appearing between said anode and cathode electrodes of said photo-thyristor.

5. A solid state switch according to claim 1, 2 or 3, wherein
said second light emitting means comprises a light emitting diode.

6. A solid state switch according to claim 4, wherein said second light emitting means comprises a light emitting diode energized in response to voltage appearing between the anode electrode and cathode electrode of said photo-thyristor and said light emitting diode is coupled to the anode and cathode electrodes of said photo-thyristor through current control means.

7. A solid state switch comprising:
an a-c current carrying electronic switching means including a pair of current carrying electrodes and at least one gate electrode, said current carrying electrodes being adapted to be connected to an a-c power supply through an a-c load to be controlled; and
triggering means for developing a trigger signal for said gate electrode of said electronic switching means, said triggering means including:
(i) rectifying means to which a-c current is supplied from said a-c power supply;
(ii) a photo-thyristor, said photo-thyristor having anode, cathode, and gate electrodes, with said anode and cathode thereof being connected to positive and negative outputs of said rectifying means, respectively;
(iii) first light emitting means for activating said photo-thyristor;
(iv) biasing means for keeping said gate electrode of said electronic switching means in a backwardly biased state when activated by light; and
(v) second light emitting means for activating said biasing means.

8. A solid state switch according to claim 7, wherein said biasing means comprises a photo-diode with anode and cathode electrodes thereof being connected, respectively, to said cathode and gate electrode of said photo-thyristor.

9. A solid state switch according to claim 7, wherein said biasing means comprises a photo-diode, with anode and cathode electrodes thereof connected to said cathode and gate electrodes of said photo-thyristor, respectively, and a resistor connected in parallel to said photo-diode.

10. A solid state switch according to claim 7, 8 or 9, wherein
said second light emitting means emits light in response to voltage appearing between said anode and cathode electrode of said photo-thyristor.

11. A solid state switch according to claim 7, 8 or 9, wherein said second light emitting means comprises a light emitting diode.

12. A solid state switch according to claim 10, wherein
said second light emitting means comprises a light emitting diode energized in response to voltage appearing between the anode and cathode of said photo-thyristor, and said light emitting diode is coupled to the anode and cathode of said photo-thyristor through current control means.

* * * * *